United States Patent
Choi

(10) Patent No.: US 8,310,289 B2
(45) Date of Patent: Nov. 13, 2012

(54) SEMICONDUCTOR APPARATUS

(75) Inventor: Hoon Choi, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/648,907

(22) Filed: Dec. 29, 2009

(65) Prior Publication Data

US 2011/0074478 A1  Mar. 31, 2011

(30) Foreign Application Priority Data

Sep. 30, 2009  (KR) .................. 10-2009-0093578

(51) Int. Cl.
*H03L 7/06* (2006.01)
(52) U.S. Cl. .................... 327/158; 327/149
(58) Field of Classification Search .................. None
See application file for complete search history.

(56) References Cited

U.S. PATENT DOCUMENTS

| | | | |
|---|---|---|---|
| 6,288,950 B1 | 9/2001 | Koike | |
| 6,304,505 B1 | 10/2001 | Forbes et al. | |
| 6,525,988 B2 | 2/2003 | Ryu et al. | |
| 6,836,437 B2 | 12/2004 | Li et al. | |
| 6,989,700 B2 * | 1/2006 | Kim | 327/158 |
| 7,573,312 B2 * | 8/2009 | Lee | 327/294 |
| 2004/0212406 A1 | 10/2004 | Jung | |
| 2006/0020835 A1 | 1/2006 | Samson et al. | |
| 2006/0023534 A1 | 2/2006 | Do | |
| 2006/0092735 A1 | 5/2006 | Do et al. | |
| 2007/0013420 A1 * | 1/2007 | Jin | 327/158 |
| 2008/0136478 A1 * | 6/2008 | Lee | 327/158 |

FOREIGN PATENT DOCUMENTS

| | | |
|---|---|---|
| JP | 2000-339959 | 12/2000 |
| JP | 2006-031922 | 2/2006 |
| KR | 10-1995-0024436 | 8/1995 |
| KR | 1020000061197 | 10/2000 |
| KR | 1020050070132 | 7/2005 |

* cited by examiner

*Primary Examiner* — Cassandra Cox
(74) *Attorney, Agent, or Firm* — Venable LLP; Jeffri A. Kaminski

(57) ABSTRACT

A semiconductor apparatus for reducing unnecessary current consumption disclosed. The semiconductor apparatus includes: a clock signal transmission unit that selectively transmits a clock signal in accordance with the frequency of the clock signal at an operation standby mode. A delay locked loop generates a DLL clock signal on the basis of the clock signal inputted through the clock signal transmission unit. The delay locked loop generates the DLL clock signal during a period where the clock signal is transmitted.

9 Claims, 3 Drawing Sheets

SEMICONDUCTOR APPARATUS

CROSS-REFERENCES TO RELATED PATENT APPLICATION

The present application claims priority under 35 U.S.C 119(a) to Korean Application No. 10-2009-0093578, filed on Sep. 30, 2009, in the Korean Intellectual Property Office, which is incorporated herein by reference in its entirety as set forth in full.

BACKGROUND

1. Technical Field

The embodiment described herein relates to a semiconductor apparatus, particularly, technology for generating a DLL clock signal.

2. Related Art

Semiconductor apparatuses operate in synchronization with reference periodic pulse signals, such as clocks, to improve operational speed and achieve an efficient internal operation. Therefore, most semiconductor apparatuses operate, using clocks supplied from the outside or, if needed, internal clocks generated inside.

Meanwhile, since the external clock signals that are inputted to the semiconductor apparatuses are delayed in the semiconductor apparatuses, outputting data using the delayed clock signals causes a problem that the outputted data do not synchronize with external clock signals. Therefore, the semiconductor apparatuses compensate for skew between an internal clock signal and an external clock signal, using a DLL (Delay locked Loop) or a PLL (Phase Locked Loop).

FIG. 1 is a timing diagram illustrating an operation of outputting data, using DLL clock signals generated from a DLL.

Referring to FIG. 1, a DLL clock signal 'DLL CLOCK' is a signal generated by compensating an external clock signal 'INPUT CLOCK' as much as the amount delayed in a semiconductor apparatus. That is, the phase of the DLL clock signal 'DLL CLOCK' is advanced by reflecting the internal delayed amount. Therefore, data 'OUTPUT DATA' that is outputted in synchronization with a clock signal "OUTPUT CLOCK' transmitted to a data output circuit through an internal clock transmission path is exactly synchronized with an external clock signal 'INPUT CLOCK'.

As described above, the DLL clock signal is used in a data output mode for outputting data; however, conventional semiconductor apparatuses still generates DLL clock signals even in modes other than a data output mode. Accordingly, current is wasted and a technology for removing this problem is needed.

SUMMARY

In one embodiment of the present invention, a semiconductor apparatus includes: a clock signal transmission unit configured to selectively transmit a clock signal in accordance with the frequency of the clock signal at an operation standby mode; and a delay locked loop configured to generate a DLL clock signal on the basis of the clock signal inputted through the clock signal transmission unit, in which the delay locked loop generates the DLL clock signal during a period where the clock signal is transmitted.

In another embodiment of the present invention, a semiconductor apparatus includes: a clock signal transmission unit configured to transmit a clock signal at a data output mode and to not transmit the clock signal at an operation standby mode; and a delay locked loop configured to generate a DLL clock signal on the basis of the clock signal inputted through the clock signal transmission unit, in which the delay locked loop generates the DLL clock signal during a period where the clock signal is transmitted.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Preferred embodiments are described hereafter in detail with reference to the accompanying drawings, in order for those skilled in the art to be able to easily implement the spirit of the present invention.

Figure 1:
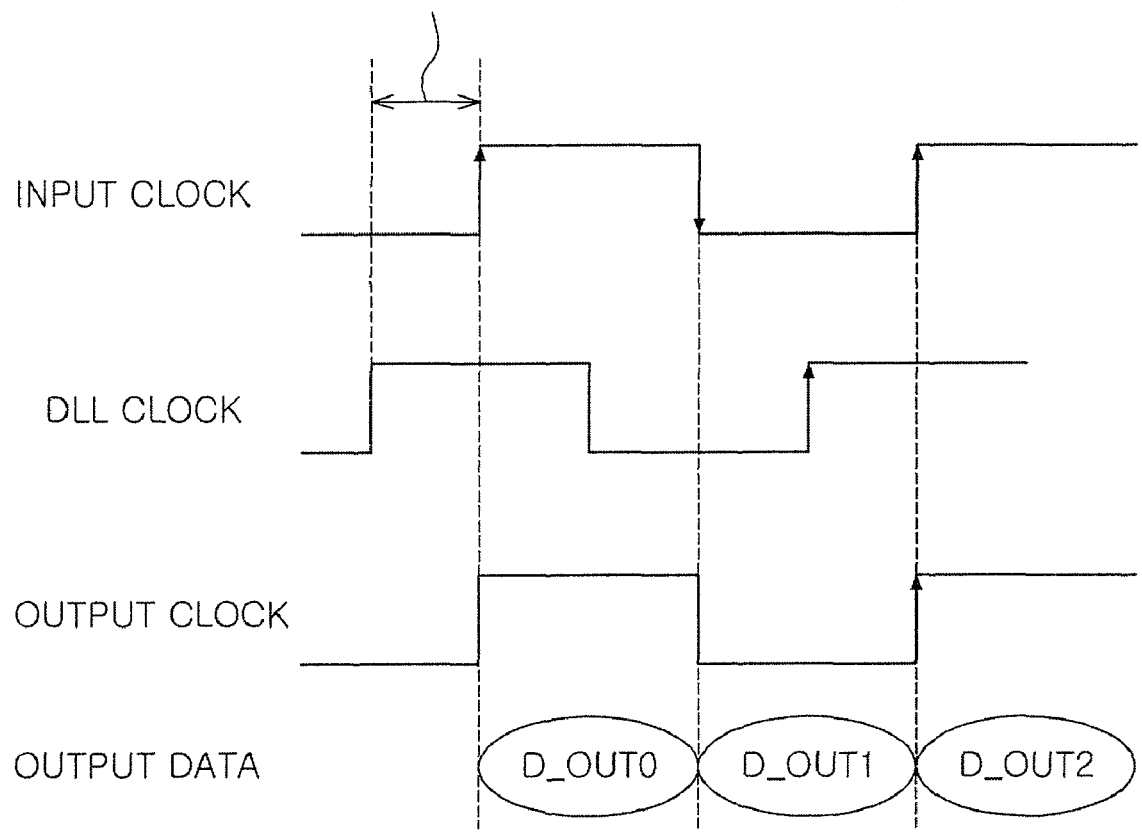
FIG. 1 is a timing diagram illustrating an operation of outputting data, using DLL clock signals generated from a DLL.
Figure 2:
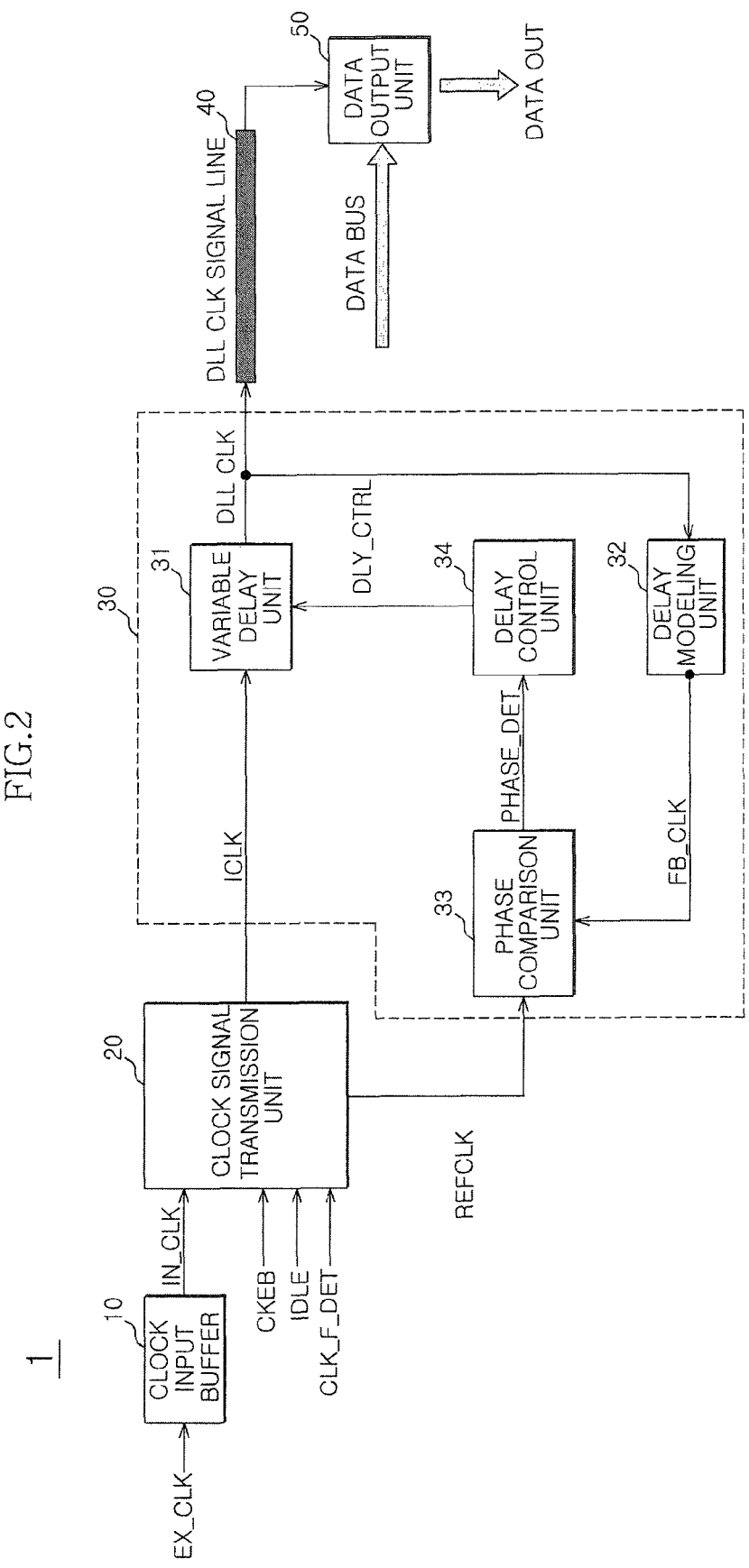
FIG. 2 is a diagram illustrating a configuration of a semiconductor apparatus according to an embodiment of the present invention.

FIG. 2 is a diagram illustrating the configuration of a semiconductor apparatus according to an embodiment of the present invention.

The semiconductor apparatus according to the present embodiment includes simple components to explain the spirit of the present invention.

Referring to FIG. 2, a semiconductor apparatus 1 includes a clock signal transmission unit 20 and a delay locked loop 30.

The detailed configuration and the main operation of the semiconductor apparatus 1 having the above configuration is described as follows.

The clock signal transmission unit 20 selectively transmits an internal clock signal 'IN_CLK' generated by buffering an external clock signal 'EX_CLK' at an operation standby mode, in accordance with the frequency of the external clock signal 'EX_CLK'.

The delay locked loop 30 generates a DLL clock signal 'DLL CLK', using the clock signals 'REFCLK' and 'ICLK' transmitted from the clock signal transmission unit 20 as an input. In this configuration, the delay locked loop 30 generates the DLL clock signal 'DLL CLK' during the period where the clock signals 'REFCLK' and 'ICLK' are transmitted, and stores the updated value of phase of the DLL clock signal 'DLL CLK', does not generate the DLL clock signal 'DLL CLK' during the period where the clock signals 'REFCLK' and 'ICLK' are not transmitted. For reference, it is preferable to construe that the clock signal is not transmitted as including that a clock signal toggling is not transmitted.

The clock signal transmission unit 20 of the present embodiment does not transmit the clock signals 'REFCLK' and 'ICLK' at an operation standby mode and a power save mode. The operation standby mode implies a standby mode where the DLL clock signal 'DLL CLK' is not used. For example, in a semiconductor memory apparatus, a standby mode before an active mode, and a standby mode after the active mode are included.

Further, the power save mode implies a mode where a signal is not communicated between the inside and outside, such as a power down mode and a self refresh mode, and a predetermined component, such as an internal power circuit, is inactivated to reduce power consumption.

On the other hand, the internal structure and the main operation of the clock input buffer 10 and the delay locked loop 30 are not directly involved with the proposed embodiment, such that they are simply described.

The clock input buffer 10 buffers an external clock signal 'EX_CLK' to be suitable to the internal operation voltage of the semiconductor apparatus.

Assuming that clock signals 'REFCLK' and 'ICLK' are transmitted from the clock signal transmission unit 20, a phase comparison unit 33 compares the phases of a feedback clock 'FB_CLK' and a clock signal 'REFCLK' transmitted from the clock signal transmission unit 20, and outputs a phase detection signal 'PHASE_DET' corresponding to the phase difference.

A delay control unit 34 generates a delay control signal 'DLY_CTRL' for adjusting the delayed amount of a variable delay unit 31 in response to the phase detection signal 'PHASE_DET'.

The variable delay unit 31 is composed of a plurality of unit delay cells and outputs a DLL clocks signal 'DLL CLK' by adjusting the delayed amount of a clock signal 'ICLK' transmitted from the clock signal transmission unit 20.

A delay modeling unit 32 outputs a feedback clock 'FB_CLK' by reflecting a modeled delay value to the DLL clock signal 'DLL CLK'. The delay value of the delay modeling unit 32 includes the delay value of the clock input buffer 10, the delay value of a clock transfer line 40, and the delay value of a data output unit 50.

If clock signals 'REFCLK' and 'ICLK' are not transmitted from the clock signal transmission unit 20, the delay control unit 34 stores a delay control signal 'DLY_CTRL' and outputs it as the initial value, when the clock signals 'REFCLK' and 'ICLK' are transmitted again from the clock signal transmission unit 20. The DLL clock signal 'DLL CLK' outputted in this process includes the last updated phase value.

For reference, unlike the present embodiment, a configuration may be possible in which the clock signal transmission unit 20 transmits clock signals 'REFCLK' and 'ICLK' at a data output mode and does not transmit clocks signals 'REFCLK' and 'ICLK' at the operation standby mode. In this configuration, a DLL clock signal 'DLL CLK' is not generated at the operation standby mode, regardless of the frequency of an external clock signal 'EX_CLK'. It is preferable to use this way, when a timing margin is sufficient to ensure a stable operation state when the mode is shifted to the data output mode.

Figure 3:
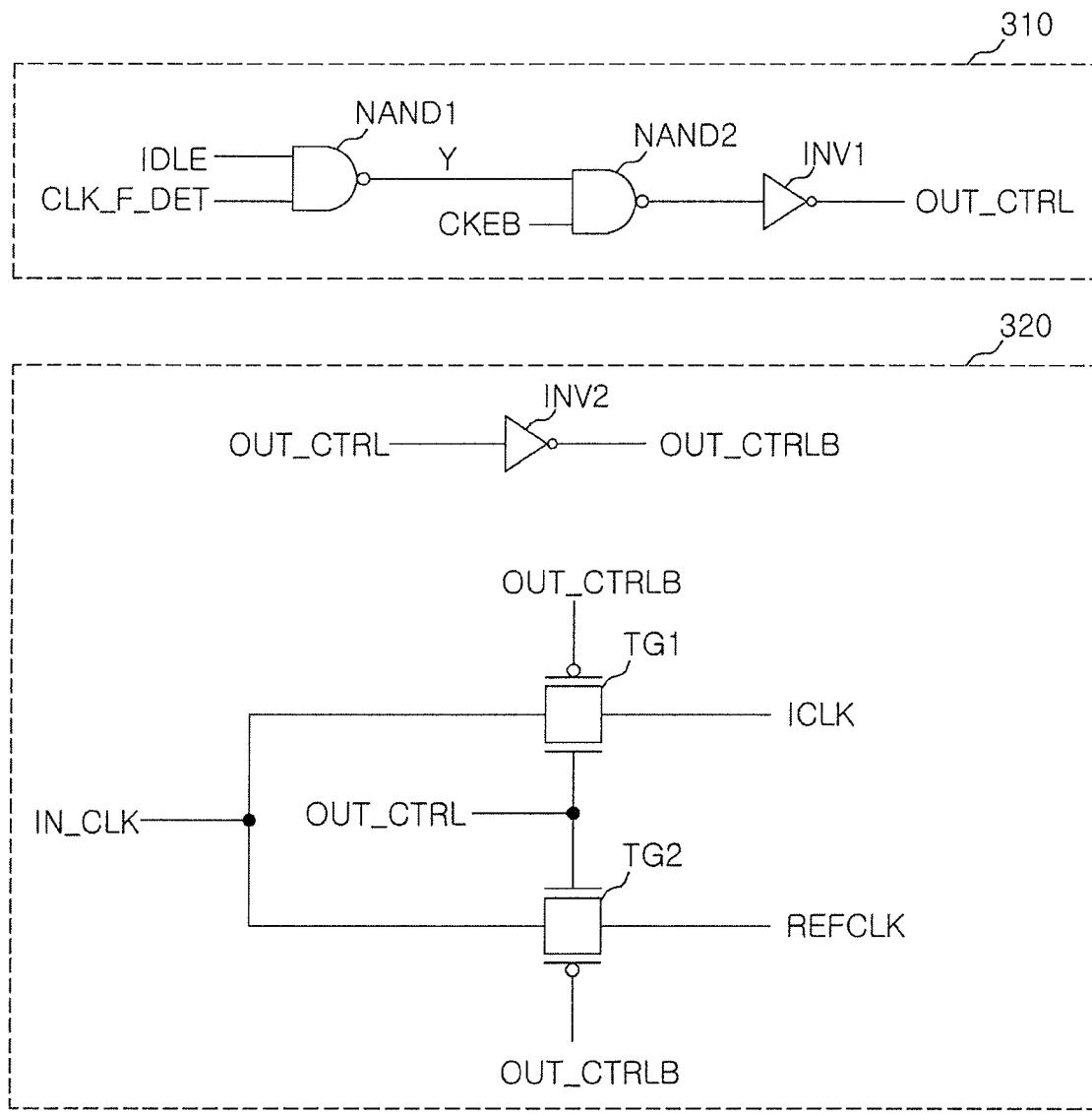
FIG. 3 is an exemplary circuit diagram of a clock signal transmission unit of the semiconductor apparatus of FIG. 2.

FIG. 3 is a circuit diagram of an exemplary clock signal transmission unit of the semiconductor apparatus of FIG. 2.

Referring to FIG. 3, the clock signal transmission unit 20 includes an output control signal generating unit 310 and a switching unit 320.

The output control signal generating unit 310 generates an output control signal 'OUT_CTRL' that is selectively activated in response to an operation standby signal 'IDLE', a clock frequency detection signal 'CLK_F_DET', and a power down signal 'CKEB'. The output control signal generating unit 310 is composed of a first logic part 'NAND1' that outputs an internal control signal 'Y' by performing a negative AND operation on the operation standby signal 'IDLE' and the clock frequency detection signal 'CLK_F_DET' and a second logic part 'NAND2' that outputs an output control signal 'OUT_CTRL' by performing a negative AND operation on the internal control signal 'Y' and the power down signal 'CKEB'. For reference, in accordance with the embodiments, the output control signal generating unit 310 may be configured to generate an output control signal 'OUT_CTRL' that is selectively activated in response to the operation standby signal 'IDLE' and the power down signal 'CKEB'.

The switching unit 320 selectively outputs clock signals 'REFCLK' and 'ICLK' in response to the output control signal 'OUT_CTRL'. The switching unit 320 is composed of transmission gates 'TG1' and 'TG2' that are controlled by the output control signal 'OUT_CTRL'.

In this configuration, the clock frequency detection signal 'CLK_F_DET' is a signal that is activated, corresponding to the frequency of an external clock signal 'EX_CLK' or the frequency of an internal clock signal 'IN_CLK' acquired by buffering the external clock signal 'EX_CLK'. In the present embodiment, the clock frequency detection signal 'CLK_F_DET' becomes a high level, when the frequency is smaller than a desired value. Further, the operation standby signal 'IDLE' is a signal that is activated at a high level at the operation standby mode, and the power down signal 'CKEB' is a signal that is activated at a low level at the power save mode.

TABLE 1

| CLK_F_DET | IDLE | Y | CKEB | OUT_CTRL |
|---|---|---|---|---|
| H | H | L | H | L |
| H | L | H | H | H |
| L | H | H | L | L |
| L | L | H | L | L |

Table 1 is a Truth Table showing the internal operation of the output control signal generating unit 310.

Referring to Table 1, when both the operation standby signal 'IDLE' and the clock frequency detection signal 'CLK_F_DET' are at a high level, the internal control signal 'Y' is at a low level, such that the output control signal 'OUT_CTRL' is outputted at a low level, regardless of the power down signal 'CKEB'. When the output control signal 'OUT_CTRL' is at a low level, the switching unit 320 does not transmit the clock signals 'REFCLK' and 'ICLK'. That is, the frequency of the external clock signal 'EX_CLK' is lower than a desired value and the clock signals 'REFCLK' and 'ICLK' are not transmitted, when it enters to the operation standby mode.

Further, when the power down signal 'CKEB' is activated at a low level, the output clock signal 'OUT_CTRL' is outputted at a low level, such that the switching unit 320 does not transmit the clock signals 'REFCLK' and 'ICLK'. That is, when it enters the power save mode, such as the power down mode and the self refresh mode, the clock signals 'REFCLK' and 'ICLK' are not transmitted.

Meanwhile, when the output control signal generating unit 310 is configured to generate an output control signal 'OUT_CTRL' that is selectively activated in response to the operation standby mode 'IDLE' and the power down signal 'CKEB', when it enters the operation standby mode, the clock signals 'REFCLK' and 'ICLK' are not transmitted, regardless of the frequency of the external clock signal 'EX_CLK'. In this configuration, the operation standby signal 'IDLE' is defined as a signal representing the operation standby mode or the data output mode.

To sum up, the fact that the clock signals 'REFCLK' and 'ICLK' are not transmitted means that the DLL clock signal is not generated in that period; therefore, it is possible to reduce unnecessary current consumption at the operation standby mode.

As described above, a semiconductor apparatus according to an embodiment of the present invention stops generating the DLL clock signal, when the frequency of the clock signal is low, in consideration of the frequency of the clock signal at the operation standby mode. In this operation, since the updated value of the phase of the DLL clock signal has been stored and the timing margin is sufficient due to the low frequency, it is possible to ensure operational stability, when the operation standby mode is converted into the data output mode. Further, it is possible to reduce unnecessary current consumption in the period where the DLL signal is not used. Further, since in addition to the power save mode, at the operation standby mode, generating the DLL clock signal is stopped, it is possible to reduce unnecessary current consumption in the period where the DLL clock signal is not used.

The present invention was described in detail with reference to the embodiments in the above. For reference, though not directly involved with the spirit of the present invention, embodiments including additional configurations can be exemplified to describe in more detail the present invention. Further, the configuration of the active high and the active low for representing the activated state of signals and circuits may be changed in accordance with embodiments. Numerous changes of the circuits are possible various and can be easily inferred by any one of those skilled in the art; therefore, the variation is not described herein.

While certain embodiments have been described above, it will be understood that the embodiments described are by way of example only. Accordingly, the device and method described herein should not be limited based on the described embodiments. Rather, the devices and methods described herein should only be limited in light of the claims that follow when taken in conjunction with the above description and accompanying drawings.

What is claimed is:

1. A semiconductor apparatus comprising:
   a clock signal transmission unit configured to selectively transmit a clock signal according to whether a frequency of the clock signal has reached a predetermined value at an operation standby mode; and
   a delay locked loop configured to generate a DLL clock signal on the basis of the clock signal transmitted through the clock signal transmission unit,
   wherein the delay locked loop generates the DLL clock signal during a period where the clock signal is transmitted.

2. The semiconductor apparatus of claim 1, wherein the clock signal transmission unit does not transmit the clock signal at a power save mode.

3. The semiconductor apparatus of claim 2, wherein the delay locked loop keeps an updated value of a phase of the DLL clock signal during the period where the clock signal is not transmitted.

4. The semiconductor apparatus of claim 1, the clock signal transmission unit includes:
   an output control signal generating unit configured to generate an output control signal that is selectively activated in response to an operation standby signal and a clock frequency detection signal; and
   a switching unit configured to selectively output the clock signal in response to the output control signal.

5. The semiconductor apparatus of claim 4, wherein the clock frequency detection signal is activated in accordance with the frequency of the clock signal.

6. The semiconductor apparatus of claim 2, wherein the clock signal transmission unit includes:
   an output control signal generating unit configured to generate an output control signal that is selectively activated in response to an operation standby signal, a clock frequency detection signal, and a power down signal; and
   a switching unit configured to selectively output the clock signal in response to the output control signal.

7. The semiconductor apparatus of claim 6, wherein the clock frequency detection signal is activated in accordance with the frequency of the clock signal.

8. A semiconductor apparatus comprising:
   a clock signal transmission unit configured to transmit a clock signal at a data output mode and to not transmit the clock signal at an operation standby mode; and
   a delay locked loop configured to generate a DLL clock signal on the basis of the clock signal transmitted through the clock signal transmission unit,
   wherein the delay locked loop generates the DLL clock signal during a period where the clock signal is transmitted and keeps an updated value of a phase of the DLL clock signal during the period where the clock signal is not transmitted.

9. The semiconductor apparatus of claim 8, wherein the clock signal transmission unit does not transmit the clock signal at a power save mode.

* * * * *